United States Patent
Linton et al.

(10) Patent No.: US 12,248,000 B1
(45) Date of Patent: *Mar. 11, 2025

(54) RADIO FREQUENCY PERFORMANCE CHARACTERIZATION OF MULTI-CARRIER BROADBAND DEVICES

(71) Applicant: Charter Communications Operating, LLC, St. Louis, MO (US)

(72) Inventors: Diana Linton, Parker, CO (US); Esteban Sandino, Greenwood Village, CO (US)

(73) Assignee: Charter Communications Operating, LLC, St. Louis, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/481,586

(22) Filed: Oct. 5, 2023

Related U.S. Application Data

(63) Continuation of application No. 17/864,231, filed on Jul. 13, 2022, now Pat. No. 11,821,914.

(51) Int. Cl.
   *G01R 1/04* (2006.01)
   *G01R 31/28* (2006.01)
   *H04B 17/00* (2015.01)

(52) U.S. Cl.
   CPC ....... *G01R 1/0416* (2013.01); *G01R 31/2884* (2013.01); *H04B 17/0085* (2013.01)

(58) Field of Classification Search
   CPC ............. G01R 1/0416; G01R 31/2884; H04B 17/0085
   USPC ........................................ 324/637, 629, 600
   See application file for complete search history.

(56) References Cited

U.S. PATENT DOCUMENTS

| | | | |
|---|---|---|---|
| 10,333,634 B1 * | 6/2019 | Abadie | H04B 17/0085 |
| 11,536,852 B2 * | 12/2022 | Cheng | G01S 19/23 |
| 11,671,186 B1 * | 6/2023 | Derat | H04B 17/102 |
| | | | 455/67.14 |
| 2018/0188317 A1 * | 7/2018 | Maiellaro | G01R 31/2884 |
| 2020/0083964 A1 * | 3/2020 | Vella-Coleiro | H04B 17/16 |
| 2024/0204888 A1 * | 6/2024 | Kuhn | H04B 17/0085 |

* cited by examiner

*Primary Examiner* — Giovanni Astacio-Oquendo
(74) *Attorney, Agent, or Firm* — Dority & Manning, P.A.

(57) ABSTRACT

A notched test signal is generated across a frequency band, the notched test signal includes a plurality of frequency notches, each frequency notch associated with one of a plurality of test frequencies. The notched test signal is provided to a device under test at a plurality of different input power levels. An notched output signal is received from the device under test. The notched output signal is filtered to provide a bandpass response at the plurality of test frequencies to generate a filtered notched output signal. A power level of the filtered notched output signal at each of the plurality of test frequencies is measured. A noise performance metric associated with the device under test is determined based at least in part on the power level of the filtered notched output signal.

19 Claims, 12 Drawing Sheets

RADIO FREQUENCY PERFORMANCE CHARACTERIZATION OF MULTI-CARRIER BROADBAND DEVICES

RELATED APPLICATION

This application is a continuation of co-pending U.S. patent application Ser. No. 17/864,231, filed on Jul. 13, 2022, entitled "RADIO FREQUENCY PERFORMANCE CHARACTERIZATION OF MULTI-CARRIER BROADBAND DEVICES," which is hereby incorporated herein by reference in its entirety.

BACKGROUND

Radio frequency devices, such as multicarrier broadband devices, can provide for the transmission and processing of signals, such as cable television signals (CATV signals). Developments have expanded an operational spectrum of multicarrier broadband devices used for the transmission and processing of CATV signals from, for instance, about 54 MHz to about 1.8 GHz.

SUMMARY

The embodiments disclosed herein are directed to systems and methods to enhance the radio frequency (RF) performance characterization (e.g., noise performance characterization) of RF devices, such as multicarrier broadband devices or systems, across a large operational frequency spectrum.

In one embodiment, a method is provided. The method includes generating a notched test signal across a frequency band. The notched test signal includes a plurality of frequency notches. Each frequency notch is associated with one of a plurality of test frequencies. The method includes providing the notched test signal to a device under test at a plurality of different input power levels. The method includes receiving a notched output signal from the device under test. The method includes filtering the notched output signal to provide a bandpass response at each of the plurality of test frequencies to generate a filtered notched output signal. The method includes measuring a power level of the filtered notched output signal at each of the plurality of test frequencies. The method includes determining a noise performance metric associated with the device under test based at least in part on the power level of the filtered notched output signal.

Individuals will appreciate the scope of the disclosure and realize additional aspects thereof after reading the following detailed description of the examples in association with the accompanying drawing figures.

BRIEF DESCRIPTION OF THE DRAWINGS

The accompanying drawing figures incorporated in and forming a part of this specification illustrate several aspects of the disclosure and, together with the description, serve to explain the principles of the disclosure.

DETAILED DESCRIPTION

Figure 1:
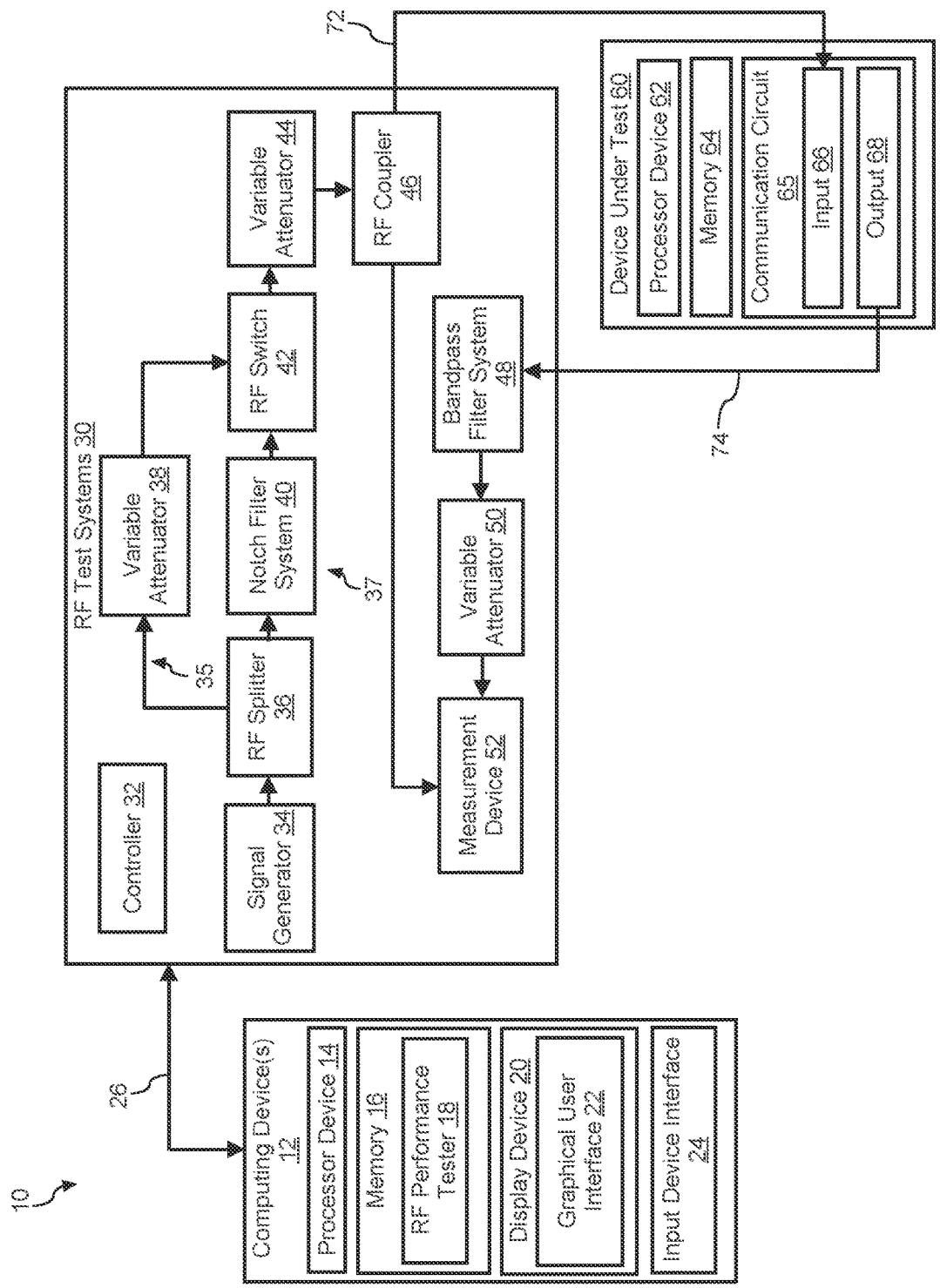
FIG. 1 depicts a block diagram of a system for radio frequency (RF) performance characterization of multi-carrier broadband devices according to example embodiments of the present disclosure.

The examples set forth below represent the information to enable individuals to practice the examples and illustrate the best mode of practicing the examples. Upon reading the following description in light of the accompanying drawing figures, individuals will understand the concepts of the disclosure and will recognize applications of these concepts not particularly addressed herein. It should be understood that these concepts and applications fall within the scope of the disclosure and the accompanying claims.

Any flowcharts discussed herein are necessarily discussed in some sequence for purposes of illustration, but unless otherwise explicitly indicated, the examples are not limited to any particular sequence of steps. The use herein of ordinals in conjunction with an element is solely for distinguishing what might otherwise be similar or identical labels, such as "first message" and "second message," and does not imply an initial occurrence, a quantity, a priority, a type, an importance, or other attribute, unless otherwise stated herein. The term "about" used herein in conjunction with a numeric value means any value that is within a range of ten percent greater than or ten percent less than the numeric value.

As used herein and in the claims, the articles "a" and "an" in reference to an element refers to "one or more" of the element unless otherwise explicitly specified. The word "or" as used herein and in the claims is inclusive unless contextually impossible. As an example, the recitation of A or B means A, or B, or both A and B. The word "data" may be used herein in the singular or plural depending on the context.

Embodiments of the present disclosure are directed to systems and methods to enhance the radio frequency (RF) performance characterization (e.g., noise performance characterization) of RF devices, such as multicarrier broadband devices or systems, across a large operational frequency spectrum. Noise performance characterization of RF devices can allow for the determination of suitable operating ranges for the RF devices for near distortion-free device operation. For instance, noise performance characterization can provide for the determination of a boundary between linear and non-linear operating regions for an RF device. Noise performance characterization can also provide for the determination of a boundary between a clipping region and a non-clipping region of the RF device.

Noise performance characterization can include measuring noise-to-power ratio (NPR) or other suitable metric across various input power levels for input signals provided to an RF device. NPR testing systems, however, can have narrow testing bandwidths. For instance, example NPR testing systems can implement a single notch filter to provide a frequency notch in a test signal. A measurement device can determine noise accumulated in the single notch across various input power levels.

These NPR testing systems, however, can use a single frequency notch at a time, and the bandwidth of operation is not wide enough to measure extended spectrum devices or systems. NPR measurements across a wide operational spectrum (e.g., across the entire cable television (CATV) operational spectrum of about 54 MHz to about 1.8 GHZ) using these systems can require manual configuration of many different test setups at different test frequencies and the performance of multiple tests. A user would have to aggregate the results of the multiple tests to provide useful noise performance characterization for the device across the full operational spectrum of the device.

Example embodiments of the present disclosure include test systems and methods that provide for automated RF performance characterization of broadband RF devices across the full operational spectrum of the device under a computer-based control system or other control system. The automated RF performance characterization according to example embodiments can generate a test signal across a full operational spectrum (e.g., the CATV operational spectrum of about 54 MHz to about 1.8 GHZ) for a device under test, such as a multicarrier broadband device or system used to process and transmit CATV signals. The system can generate a notched test signal by introducing multiple frequency notches into the test signal at pre-determined test frequencies. As the RF device under test processes the notched test signal, the notches will accumulate noise and other distortions at the predetermined test frequencies. A measurement device can measure noise accumulated in the notches to provide noise performance characterization for the RF device under test at pre-determined test frequencies.

The present disclosure discusses example embodiments with reference to a device under test that is a multicarrier broadband device configured to transmit and process CATV signals for purposes of illustrations and discussion. Those of ordinary skill in the art, using the disclosures provided herein, will understand that the systems and methods described herein can provide for the RF performance characterization of other RF devices without deviating from the scope of the present disclosure.

The example methods provided herein can be implemented using a computer-based control system or other automated control system that can automatically control RF test equipment to generate a test signal (e.g., noise signal) for input into a device under test. The system can automatically introduce multiple notches at multiple test frequencies using a plurality of notch filters into the test signal based on parameters specified by a user (e.g., via a user interface). The system can provide the notched test signal to the device under test while automatically increasing the signal level amplitude (e.g., the power level) of the notched test signal.

The system can automatically accept or receive the test signal after it has been processed by the device under test as an output signal. The system can automatically direct the output signal from the device under test into one or more RF bandpass filters. The system can automatically configure the one or more RF bandpass filters to be matched with or to be synchronized with the notch filters. For instance, the system can configure the RF bandpass filters to provide a bandpass response at the same test frequencies notched from the test signal using the one or more notch filters.

After the signal has passed through the one or more bandpass filters, the system can automatically take measurements of the noise floor accumulated in the notches. The system can continue to measure the noise floor accumulated in the notches as the signal level amplitude of the notched test signal increases. The system can automatically record and plot the ratio of the noise level within the notches to the signal level amplitude of the input test signal provided to the device under test.

The system can provide the output plots for display on a graphical user interface presented on a display device or other suitable output. The output plots can be, for instance, carrier-to-noise+interference plots, carrier-to-noise+distortion plots, Carrier-to-Intermodulation Noise (CIN) plots, Carrier-to-Composite Noise (CCN) plots, Noise Power Ratio (NPR) plots, or other plots indicative of noise performance characterization of the RF device under test. In some embodiments, the output plots can be displayed with a horizontal axis representing input or output power in dBmV/Hz, dBmV/MHz, or other suitable units. The system can display the output plots with a vertical axis representing the ratio of signal to distortion or signal to composite noise level. The system can provide output plots for multiple frequencies to provide a full noise performance characterization of the device under test across multiple operational frequencies.

As part of the system, the user can define various parameters for conducting the test. As nonlimiting examples, a user can provide, via a suitable user interface, parameters specifying operational bandwidth, input signal level amplitude ranges, individual test frequencies, depth of notches for the test signal, bandwidth of notches for the test signal, and other parameters. The system can automatically configure one or more notch filters based at least in part on the user defined parameters. The system can automatically configure one or more bandpass filters to match or to be synchronized with the notch filters. In some embodiments, the system can automatically determine parameters including test frequencies, depth of notches, bandwidth of notches, and/or other parameters based at least in part on the operational bandwidth of the test.

Aspects of the present disclosure provide technical effects and benefits. For instance, the system can provide noise performance characterization across the full operational spectrum of a broadband RF device. The noise performance characterization can provide for the determination of suitable operating ranges for the RF device to reduce, for instance, non-linear operation and/or clipping at the RF device. In addition, aspects of the present disclosure provide an improvement to computer-based control technology. For instance, example test methods provided herein can be implemented using automated computer-based control systems. Implementation of multiple notches into the RF test signal and automated synchronization of bandpass filters for the output signals from the RF device can allow for testing the full operational spectrum of a broadband RF device using a reduced set of test runs. This can reduce the need for repeated configurations of RF testing equipment to implement tests based on user defined settings, reducing computing resources required to control RF equipment and reducing memory resources required to store results.

Finally, it is noted that while, for purposes of illustration and simplicity, the embodiments are illustrated as being implemented by a computer system that comprises a single computing device that in turn comprises a single processor device, in practice the examples/embodiments disclosed herein may be implemented in a computer system that comprises any number of computing devices, each of which may comprise one or more processor devices. Thus, irrespective of the implementation, the examples/embodiments may be implemented on a computer system that includes one or more computing devices, wherein the one or more computing devices comprise one or more processor devices, and the one or more processor devices are configured to implement functionality disclosed herein.

FIG. 1 is a block diagram of a system for RF performance characterization of a multicarrier broadband RF device according to example embodiments of the present disclosure. The system 10 can include a computing device 12 coupled to an RF test system 30. The computing device 12 can include a processor device 14 coupled to a memory 16, an RF performance tester 18, a display device 20 configured to provide information for display via, for instance, a graphical user interface 22, and an input device interface 24 configured to allow a user to interact with and provide information to the computing device 12. Details concerning example components of the computing device 12 will be discussed with reference to FIG. 9.

Referring to FIG. 1, the RF performance tester 18 is configured to implement functionality disclosed herein to assess RF performance characteristics of an RF device under test 60. For instance, the RF performance tester 18 can receive user-defined inputs that are provided from a user through input device interface 24 and can communicate the user-defined inputs to an RF test system 30. The RF test system 30 can process RF signals as discussed herein and provide test signals to the device under test 60. The RF test system 30 can measure characteristics of signals output from the device under test 60 and communicate measured information to the RF performance tester 18. The RF performance tester 18 can determine outputs, such as carrier-to-noise+interference, carrier-to-noise+distortion, CIN, CCN, and/or NPR plots and/or other information for display to a user via the graphical user interface 22. The computing device 12 can output information determined by the RF performance tester 18 in other ways without deviating from the scope of the present disclosure (e.g., through a printer, through audio speakers, etc.).

Because the RF performance tester 18 is a component of the computing device 12, functionality implemented by RF performance tester 18 may be attributed to the computing device 12 generally. Moreover, in examples where the RF performance tester 18 comprises software instructions that program the processor device 14 to carry out functionality discussed herein, functionality implemented by RF performance tester 18 may be attributed herein to the processor device 14.

It is further noted that while the RF performance tester 18 is shown as a single component, in other implementations, the RF performance tester 18 may be implemented in a plurality of components. Finally, it is noted that while, for purposes of illustration and simplicity, the embodiments are illustrated as being implemented by a single processor device on a single computing device, in other environments, such as a distributed and/or clustered environment, and where the RF performance tester 18 is implemented in multiple components, the RF performance tester 18 can be implemented on a computer system that includes a plurality of processor devices of a plurality of different computing devices. Thus, irrespective of the implementation, the embodiments may be implemented on a computer system that includes one or more processor devices of one or more computing devices.

The computing device 12 can communicate with the RF test system 30 (e.g., with a controller 32) via a communication link 26. The communication link 26 can be any suitable wired and/or wireless communication link. In some embodiments, the communication link 26 can include one or more of a universal serial bus (USB) communication link, a serial communication link, an Ethernet communication link, a general-purpose interface bus (GPIB) communication link, or other suitable communication link. The communication link can include communication over one or more networks, including one or more local area networks, wide area networks (e.g., the Internet), private networks, controller area networks (CAN) or other networks.

The RF test system 30 can include a controller 32, a signal generator 34, an RF splitter 36, a first variable attenuator 38, a notch filter system 40, an RF switch 42, a second variable attenuator 44, an RF coupler 46, a bandpass filter system 48, a third variable attenuator 50, and a measurement device 52. The controller 32 is configured to receive information from the RF performance tester 18 and provide control signals to various components of the RF test system 30 based on the information. The controller 32 can include one or more microcontrollers, one or more processors and memory devices, one or more application specific integrated circuits, one or more field programmable gate arrays (FPGAs), and/or other control circuits configured to control components of the RF test system 30 based on information and parameters received from the RF performance tester 18. The controller 32 can send control signals (e.g., via a control bus) to control and/or configure components of the RF test system 30, including a signal generator 34, an RF splitter 36, a first variable attenuator 38, a notch filter system 40, an RF switch 42, a second variable attenuator 44, an RF coupler 46, a bandpass filter system 48, a third variable attenuator 50, and/or a measurement device 52.

Aspects of the present disclosure are discussed with reference to the controller 32 being separate from the computing device 12 for purposes of illustration and discussion. Those of ordinary skill in the art, using the disclosures provided herein, will understand that the controller 32 can be implemented as a part of the computing device 12 without deviating from the scope of the present disclosure.

The RF test system 30 can include a signal generator 34. The signal generator 34 can be a noise source or a modulator. The signal generator 34 can be configured to generate a test signal, for instance, based on control signals from the controller 32. The signal generator 34 can be coupled to an RF splitter 36. The RF splitter 36 can be configured to split the test signal from the signal generator 34 between a first path 35 and a second path 37. In some embodiments, the RF splitter 36 can be a passive device configured to split RF signals, such as a two-way power splitter configured to split one channel into two equal or unequal channel outputs. In some embodiments, the RF splitter 36 can be an active device that includes one or more splitter circuits controlled based on signals from the controller 32.

The first path 35 can include a first variable attenuator 38 configured to adjust a power level (e.g., amplitude) of the test signal passing through the first path 35. In some embodiments, the first variable attenuator 38 can be configured to increase and/or decrease the power level of the test signal, for instance, based on a voltage signal, current signal, or other signal provided to the first variable attenuator 38 from the controller 32. In some embodiments, the first variable attenuator 38 can be a digitally controlled RF attenuator that controls signal level based on control signals from the controller 32.

The second path 37 can include a notch filter system 40 configured to implement one or more frequency notches (e.g., stop bands) in the test signal to generate a notched test signal. In some embodiments, the notch filter system 40 can have one or more circuit elements, such as transmission lines, inductors, and/or capacitors. One or more of the circuit elements can be tunable or variable (e.g., based on control signals from the controller 32) to provide notch filtering (stop bands) at selected frequencies. In some embodiments, the notch filter system 40 can be implemented using a digital filter implemented, for instance, using one or more field-programmable gate arrays (FPGAs), digital signal processor (s), application-specific integrated circuits (ASICs), or other components.

The first path 35 and the second path 37 are coupled to an RF switch 42. The RF switch 42 is configured to switch between the first path 35 to provide an unnotched test signal to the second variable attenuator 44 and a second path 37 to provide a notched test signal to the second variable attenuator 44. The RF switch 42 can be an active device under the control of the controller 32.

The second variable attenuator 44 can be configured to adjust a power level (e.g., amplitude) of the notched test signal or the unnotched test signal provided from the RF switch 42. In some embodiments, the second variable attenuator 44 can be configured to increase and/or decrease the power level of the test signal, for instance, based on a voltage signal, current signal, or other signal provided to the second variable attenuator 44 from the controller 32. In some embodiments, the second variable attenuator 44 can be a digitally controlled RF attenuator that controls signal level based on control signals from the controller 32.

The second variable attenuator 44 can provide the notched test signal or the unnotched test signal depending on the state of the RF switch 42 to the RF coupler 46. The RF coupler 46 can be configured to couple the notched test signal or the unnotched test signal to the device under test 60. The RF coupler 46 can also provide signals from the variable attenuator 44 directly to a measurement device 52.

The RF test system 30 can receive output signals from the device under test 60 and provide the output signals to a bandpass filter system 48. The output signals can include notched output signals based on processing of a notched test signal by the device under test 60 and unnotched output signals based on processing of an unnotched test signal by the device under test 60. The bandpass filter system 48 can be configured to implement a bandpass response at one or more frequencies. In some embodiments, the bandpass filter system 48 can have one or more circuit elements, such as transmission lines, inductors, and/or capacitors. One or more of the circuit elements can be tunable or variable (e.g., based on control signals from the controller 32) to provide a bandpass response at selected frequencies. In some embodiments, the bandpass filter system 48 can be implemented using a digital filter implemented, for instance, using one or more FPGAs, digital signal processors, ASICS, or other approach.

The RF bandpass filter system 48 can provide filtered output signals to the third variable attenuator 50. The third variable attenuator 50 can be configured to adjust a power level (e.g., amplitude) of the RF signal provided from the bandpass filter system 48. In some embodiments, the third variable attenuator 50 can be configured to increase and/or decrease the power level of the RF signals, for instance, based on a voltage signal, current signal, or other signal provided to the third variable attenuator 50 from the controller 32. In some embodiments, the third variable attenuator 50 can be a digitally controlled RF attenuator that controls signal level based on control signals from the controller 32.

The measurement device 52 can be configured to measure power levels of RF signals at different frequencies. In some embodiments, the measurement device 52 can be an RF power meter configured to measure RF power at different RF frequencies. In some embodiments, the measurement device 52 can be a spectrum analyzer across a frequency spectrum.

The device under test 60 can be any suitable RF device for which a user desires to assess RF performance characteristics, such as one or more noise performance metrics. In some embodiments, the device under test 60 is a multicarrier broadband device suitable for transmission and processing of CATV signals in a frequency range of, for instance, between about 54 MHz to about 1.8 GHz. The device under test 60 can include a processor device 62 and a memory 64. The device under test 60 can include a communication circuit 65 configured to process and transmit RF signals, such as CATV signals. The communication circuit 65 can include an input 66 and an output 68. The input 66 can be configured to receive RF signals from, for instance, the RF test system 30 via an RF transmission line 72 (e.g., coaxial cable) or other wired and/or wireless communication link. The output 68 can be configured to transmit RF signals to, for instance, the RF test system 30 via an RF transmission line 74 (e.g., coaxial cable) or other wired and/or wireless communication link.

Figure 2A:
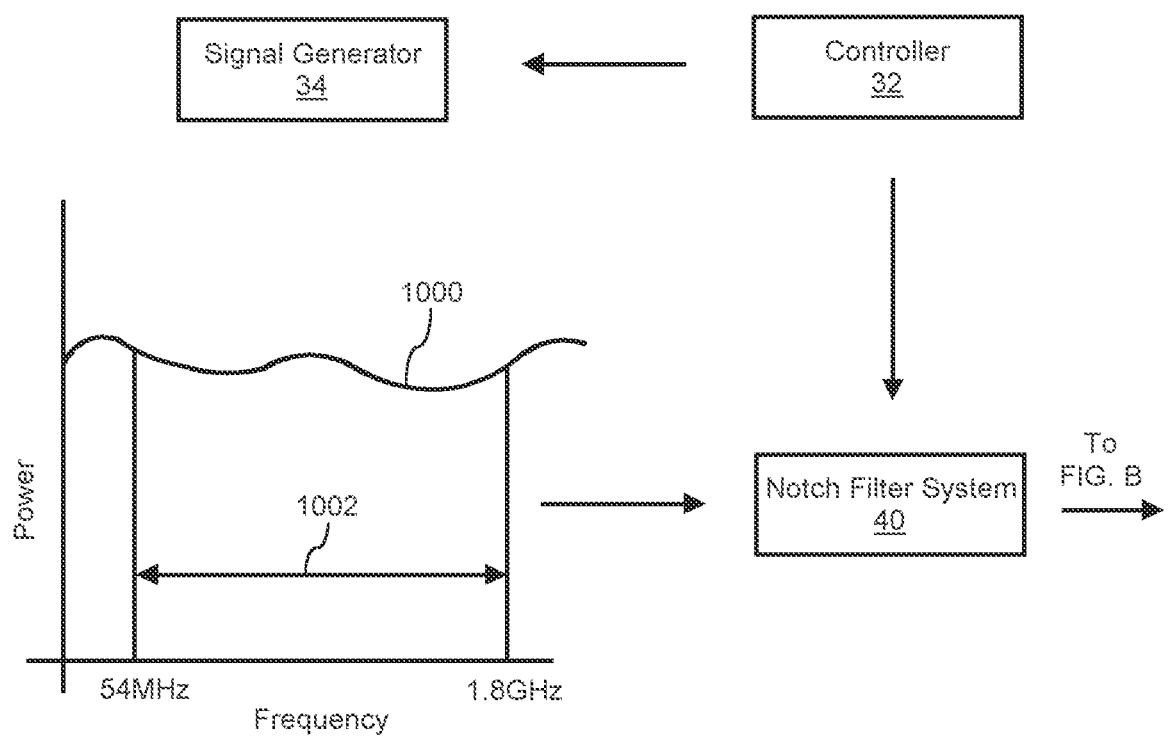
FIGS. 2A-2D depict an overview of automated RF performance characterization of RF devices according to example embodiments of the present disclosure.

FIGS. 2A-2D depict an overview of RF performance characterization of an RF device according to example aspects of the present disclosure. The RF performance characterization of an RF device shown in FIGS. 2A-2D can be implemented using the system 10 of FIG. 1. Referring to FIG. 2A, the controller 32 can control the signal generator 34 to generate a test signal 1000 (e.g., a noise signal). The test signal 1000 can have a uniform or nearly uniform amplitude/power at frequencies that span across an entire operating spectrum 1002 of the device under test. For instance, in applications where the device under test 60 is a multicarrier broadband device suitable for transmission and processing of CATV signals, the test signal can have a nearly uniform amplitude/power at frequencies that span from about 54 MHz to about 1.8 GHz. In some embodiments, the test signal 1000 can be, for instance, additive white Gaussian noise (AWGN). In some embodiments, the signal 1000 can be associated with various modulation schemes, such as single-carrier quadrature amplitude modulation (SC-QAM), orthogonal frequency-division multiplexing (OFDM), or other suitable modulation scheme.

The signal generator 34 can communicate the test signal 1000 to the notch filter system 40. The controller 32 can control the notch filter system 40 to implement frequency notches at various test frequencies in the test signal, for instance, based on user input to generate a notched test signal.

Figure 2B:
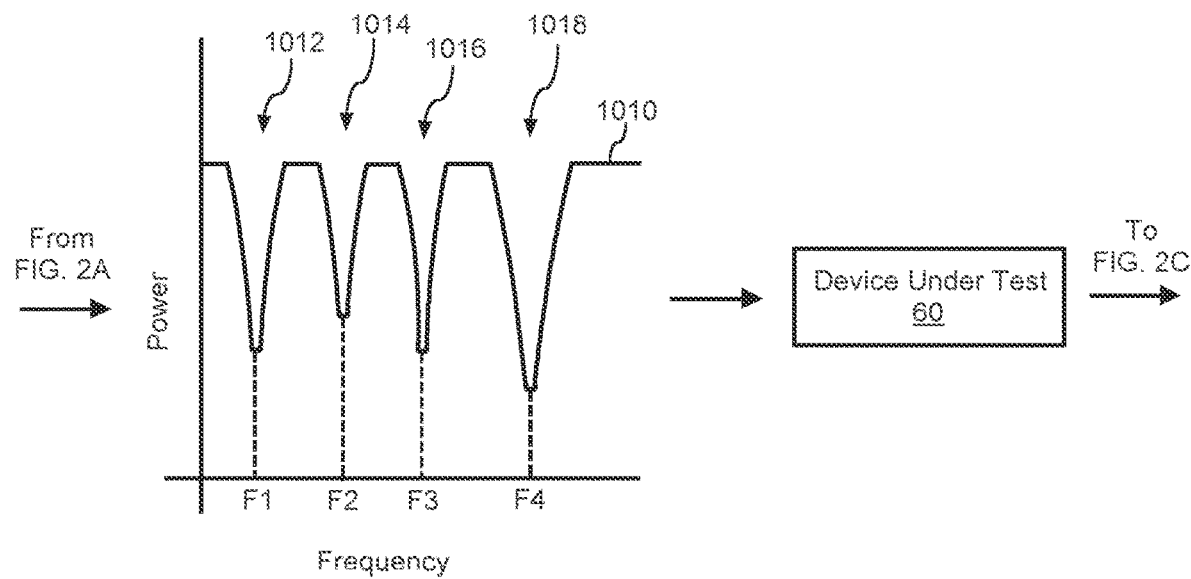

FIG. 2B depicts an example notched test signal 1010 generated at least in part using the notch filter system 40. The notched test signal 1010 includes a plurality of notches (e.g., stop bands) at test frequencies. The notches are where the filter blocks or does not pass signals associated with certain frequencies. In FIG. 2B, the notched test signal 1010 includes four notches, including a first notch 1012 at a first test frequency F1, a second notch 1014 at second test frequency F2, a third notch 1016 at a third test frequency F3, and a fourth notch 1018 at a fourth test frequency F4. The first notch 1012, the second notch 1014, the third notch 1016, and the fourth notch 1018 can have the same depth and bandwidth and/or differing depths and differing bandwidths. In some embodiments, the test frequencies, number of notches, depth of the notches, and/or bandwidth of the notches in the notched test signal 1010 can be determined based on parameters specified by a user. In some embodiments, the test frequencies, number of notches, depth of the notches, and/or bandwidth of the notches in the notched test signal 1010 can be automatically determined, for instance, by the RF performance tester 18, based on the span of the operational spectrum of the RF device under test 60.

FIG. 2B depicts a notched test signal 1010 having four notches for purposes of illustration and discussion. Those of ordinary skill in the art, using the disclosures provided herein, will understand that the notched test signal 1010 can have more or fewer notches without deviating from the scope of the present disclosure.

As shown in FIG. 2B, the system communicates the notched test signal 1010 to the device under test 60. For instance, the system communicates the notched test signal 1010 to an input 66 of the device under test 60. The device under test 60 can process the notched test signal 1010 to generate a notched output signal.

Figure 2C:
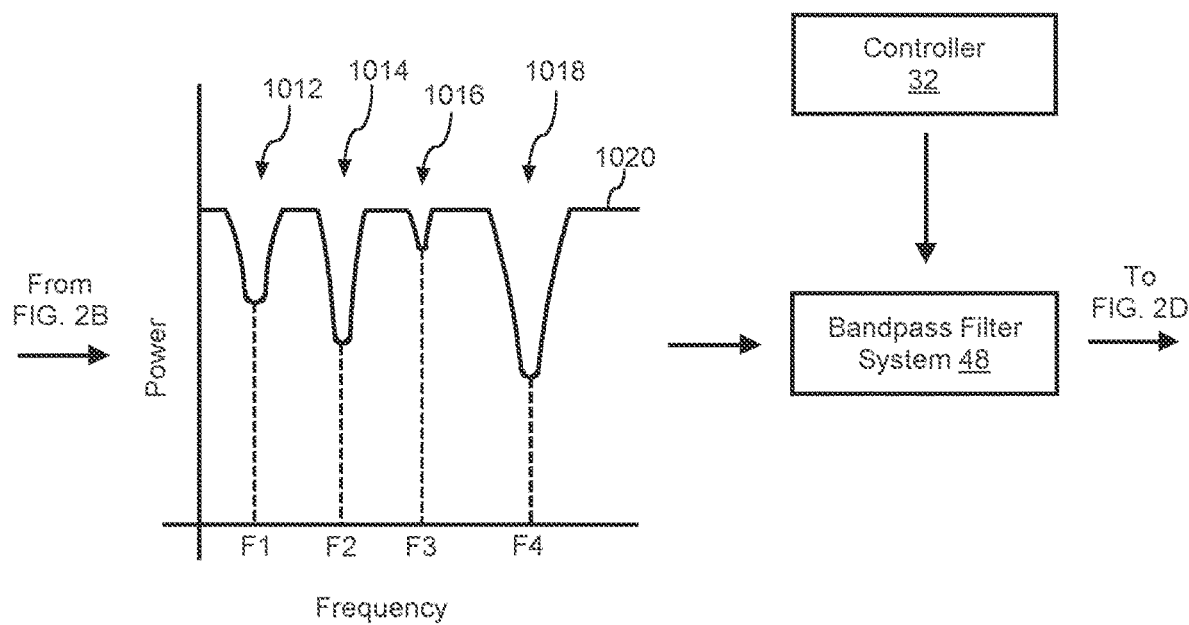

FIG. 2C depicts a notched output signal 1020 received from a device under test 60, such as from an output 68 of the device under test 60. As illustrated, the first notch 1012 has accumulated noise at the first test frequency F1 from the device under test 60. The second notch 1014 has accumulated noise at the second test frequency F2 from the device under test 60. The third notch 1016 has accumulated noise at the third test frequency F3 from the device under test 60. The fourth notch 1018 has accumulated noise at the fourth test frequency F4 from the device under test 60.

The system can provide the notched output signal 1020 to the bandpass filter system 48. The bandpass filter system 48 can be configured to provide a bandpass response at the test frequencies. For instance, the controller 32 can configure the bandpass filter system 48 to be synchronized with or to match the notch filter system 40. More particularly, the bandpass filter system 48 can be configured to provide a bandpass response for the notched output signal 1020 at each of the test frequencies associated with the first notch 1012, the second notch 1014, the third notch 1016, and the fourth notch 1018. For instance, the bandpass filter system 48 can provide a bandpass response at the first test frequency F1, the second test frequency F2, the third test frequency F3, and the fourth test frequency F4 to generate a filtered notched output signal.

Figure 2D:
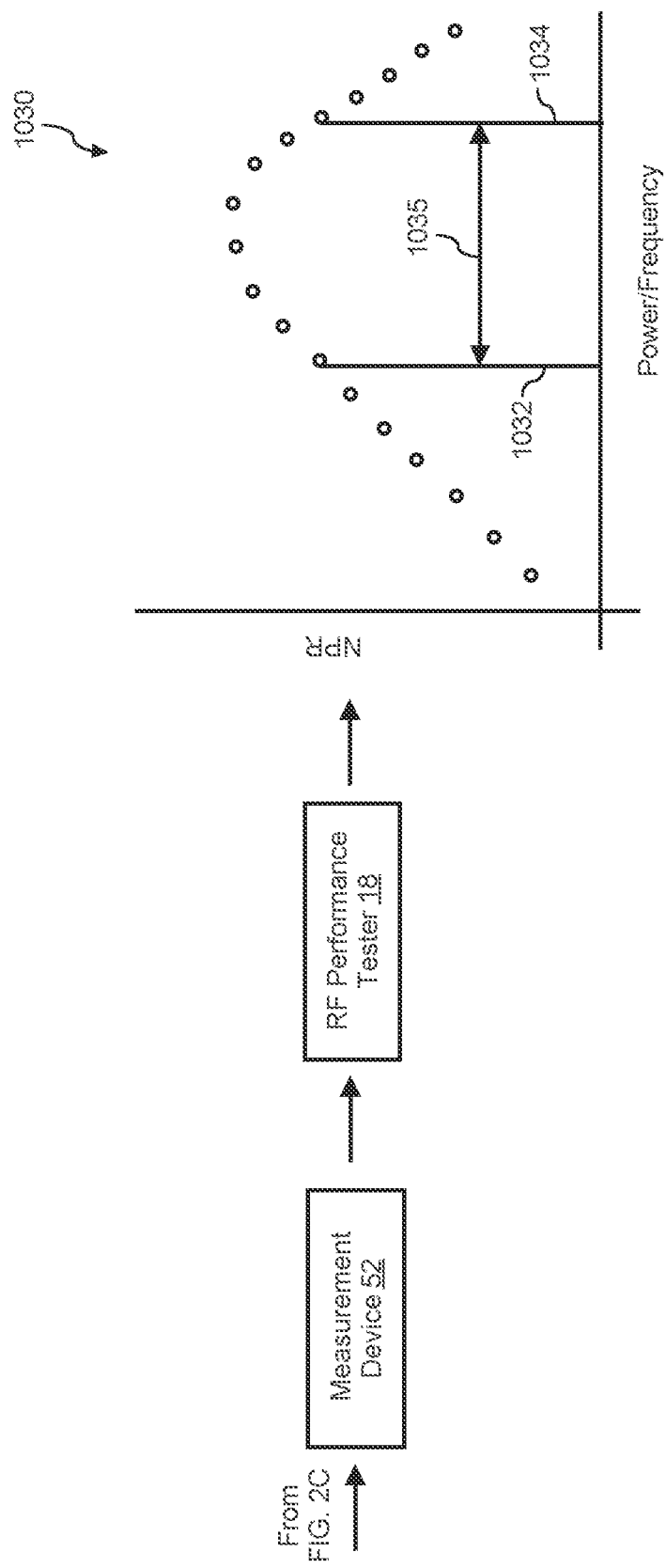

Referring to FIG. 2D, the bandpass filter system 48 can communicate the filtered notched output signal to the measurement device 52. The measurement device 52 can measure the power level of the noise accumulated in the first notch 1012, the second notch 1014, the third notch 1016, and the fourth notch 1018. The measurement device 52 can communicate the measurements to the RF performance tester 18.

As will be discussed in more detail, the RF performance tester 18 can process the measurements to determine various RF performance metrics, such as noise performance metrics. For instance, the measurement device 52 can obtain power level measurements at each of the test frequencies of the filtered notched output signal. In addition, the measurement device 52 can obtain power level measurements at each of the test frequencies of the filtered output of an unnotched output signal. The unnotched output signal can be the output of the device under test 60 after the processing of an unnotched test signal. The RF performance tester 18 can determine a noise performance metric of the device under test 60 based on a difference between the measurements associated with the filtered notched output signal and the measurements associated with the filtered unnotched output signal.

The noise performance metric can include, for instance, carrier-to-noise+interference, carrier-to-noise+distortion, CIN, CCN, NPR or other noise performance metric. The RF performance tester 18 can determine the noise performance metric at each test frequency and for varying input power levels (e.g., amplitude) of the test signals provided to the device under test 60. The RF performance tester 18 can generate noise performance plots for display to a user on, for instance a graphical user interface, of the noise performance metric.

FIG. 2D depicts an example noise performance plot 1030 associated with one of the test frequencies. The noise performance plot 1030 has a horizontal axis representing input power level. The noise performance plot 1030 has a vertical axis based on the noise performance metric (e.g., NPR). FIG. 2D depicts a single noise performance plot 1030 associated with one of the test frequencies. The RF performance tester 18 can generate a similar noise performance plot 1030 for each of the test frequencies, such as test frequency F1, test frequency F2, test frequency F3, and test frequency F4.

The noise performance plot 1030 can provide information associated with a dynamic range 1035. The dynamic range 1035 can be a region of power operation of the device under test 60 between a boundary 1032 and a boundary 1034. Boundary 1032 can represent a boundary between the linear and non-linear ranges of operation of the device under test 60. Boundary 1034 can represent a boundary between the clipping and non-clipping ranges of operation of the device under test 60.

The dynamic ranges for each test frequency can be used to determine an operating range of the device under test 60. For instance, in one embodiment, the RF performance tester 18 can automatically determine an operating range of the device under test based on the dynamic range of the device under test at each of the test frequencies. For instance, the RF performance tester 18 can determine a lower input power boundary for the operating range of the device under test 60 based at least in part on a maximum boundary between the linear and non-linear ranges for all dynamic ranges at each of the test frequencies. The RF performance tester 18 can determine an upper input power boundary for the operating range of the device under test based at least in part on a minimum boundary between the clipping and non-clipping ranges for all dynamic ranges at each of the test frequencies.

Figure 3:
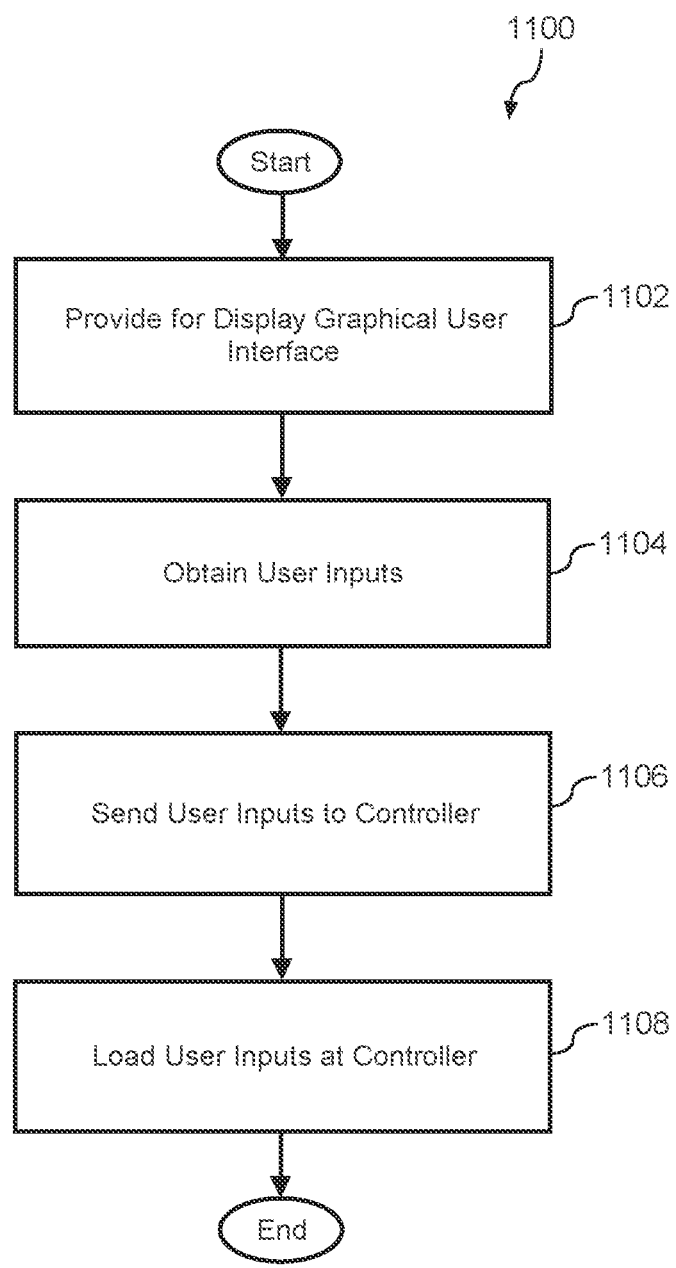
FIG. 3 depicts a flow diagram of an example data acquisition and program phase for RF performance characterization of RF devices according to example embodiments of the present disclosure.

In some embodiments, the RF performance characterization of an RF device using system 10 of FIG. 1 can include multiple phases, such as a data acquisition and programming phase, a test signal generation and calibration phase, and a measurement and calculation phase. Details concerning each of these phases will now be set forth. FIG. 3 depicts a flow diagram of an example method 1100 implemented during a data acquisition and program phase for RF performance characterization of RF devices according to example embodiments of the present disclosure. The method 1100 can be implemented, for instance, using the system 10 of FIG. 1. Although FIG. 3 depicts steps performed in a particular order for purposes of illustration and discussion, the methods of the present disclosure are not limited to the particularly illustrated order or arrangement. The various steps of method 1100 can be omitted, rearranged, combined, modified, expanded, and can include steps not illustrated and/or adapted in various ways without deviating from the scope of the present disclosure.

At 1102, the RF performance tester 18 can provide for display the graphical user interface 22 on the display device 20. The graphical user interface 22 can include fields or inputs that allow a user to specify user inputs.

At 1104, the RF performance tester 18 can obtain user inputs (e.g., via the graphical user interface 22). The user inputs can include, for instance, parameters such as: file name, input power units, number of test frequencies, bandwidth of notches, depth of notches, type of test signal (e.g., SC_QAM, OFDM, AWGN, etc.), operational spectrum of the device under test, expected dynamic range, expected NPR, maximum test signal power, input power steps (e.g., 1 dB, 5 dB, 10 dB, etc.) for adjusting input power level of the test signals, and/or other parameters.

At 1106, the RF performance tester 18 can send data indicative of the user inputs to the controller 32 associated with an RF test system 30. The RF performance tester 18 can send the data indicative of the user inputs to the controller 32 via communication link 26 using any suitable communication protocol. The communication link 26 can be, for instance, USB, serial, Ethernet, GPIB, etc.

At 1108, the controller 32 can load the user inputs received from the RF performance tester 18. As discussed in below, the controller 32 can configure the RF test system 30, such as the RF notch filter system 40 and the bandpass filter system 48, based at least in part on the user inputs.

Figure 4:
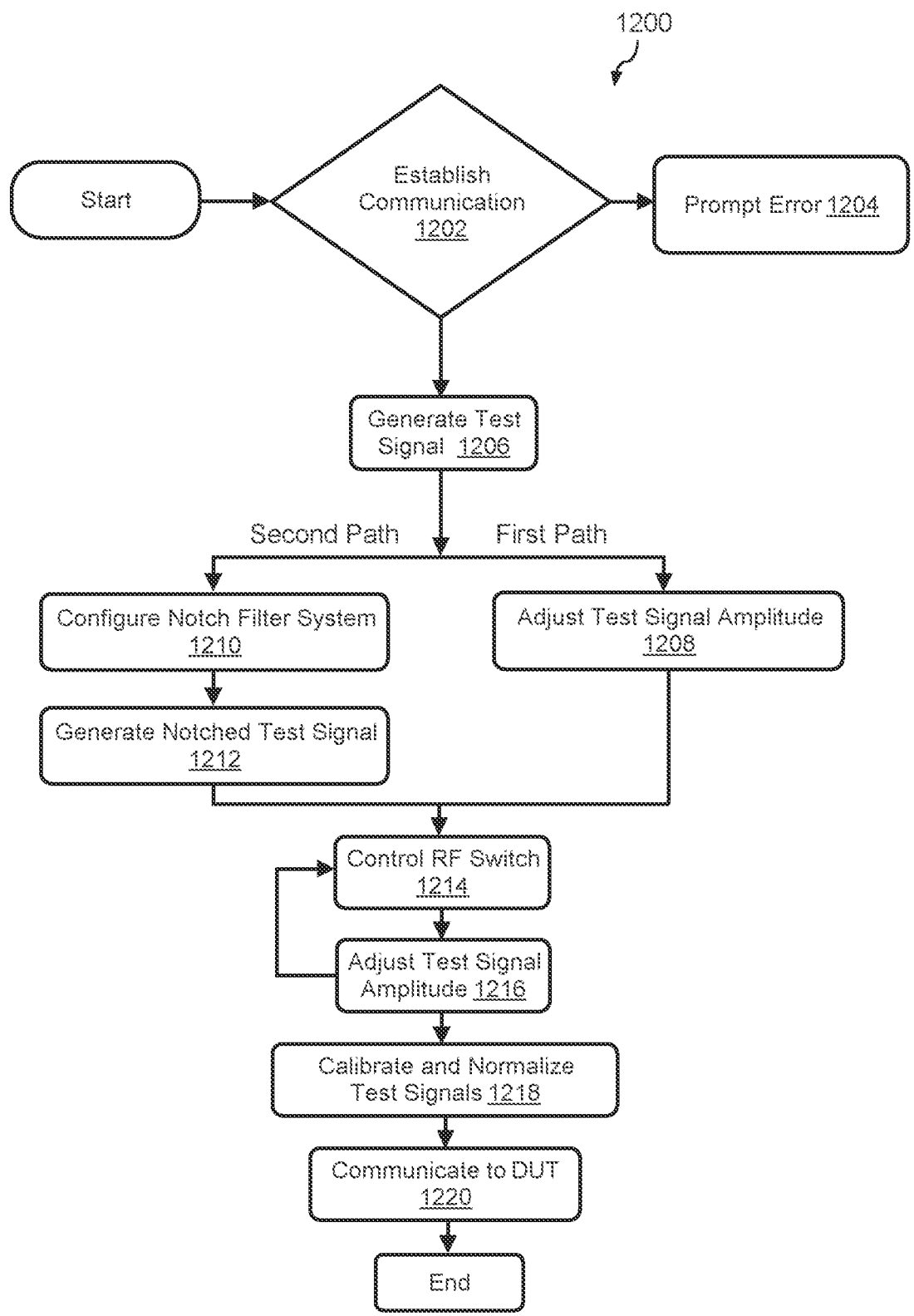
FIG. 4 depicts a flow diagram of an example signal generation and calibration phase for RF performance characterization of RF devices according to example embodiments of the present disclosure.

FIG. 4 depicts a flow diagram of an example method 1200 implemented during a test signal generation and calibration phase for RF performance characterization of RF devices according to example embodiments of the present disclosure. The method 1200 can be implemented, for instance, using the system 10 of FIG. 1. Although FIG. 4 depicts steps performed in a particular order for purposes of illustration and discussion, the methods of the present disclosure are not limited to the particularly illustrated order or arrangement. The various steps of method 1200 can be omitted, rearranged, combined, modified, expanded, include steps not illustrated and/or adapted in various ways without deviating from the scope of the present disclosure.

At 1202, the controller 32 establishes communication with components of the RF test system 30. If the controller 32 is unable to establish communication, the controller 32 prompts an error to the RF performance tester 18 as indicated at 1204. The RF performance tester 18 can cause an error message or other communication to be presented to the user, for instance, using the graphical user interface 22.

At 1206, the controller 32 sends a control signal to the signal generator 34 to generate a test signal, such as test signal 1000. The signal generator 34 can be coupled to an RF splitter 36. The RF splitter 36 can be configured to split the test signal 1000 from the signal generator 34 between a first path 35 and a second path 37.

At 1208, in the first path 35, the controller 32 controls the first variable attenuator 38 to adjust a power level (e.g., amplitude) of the test signal. The first path 35 can provide a test signal without notches (e.g., an unnotched test signal) to the RF switch 42.

At 1210, in the second path 37, the controller 32 configures the notch filter system 40 based on the user inputs. For instance, the controller 32 configures the notch filter system 40 to provide notch filtering at the test frequencies. The notch at each test frequency can have a depth and/or bandwidth based on the user input. In some embodiments, the depth and/or bandwidth of the notches can be automatically calculated (e.g., by the RF performance tester 18) based on the operational spectrum of the device under test 60.

At 1212, the notch filter system 40 can generate a notched test signal, such as notched test signal 1010. The second path 37 can provide the notched test signal to an RF switch 42. The controller 32 can control the RF switch to select between the first path 35 to deliver the unnotched test signal and the second path 37 to deliver the notched test signal to the second variable attenuator 44.

At 1214, the controller 32 controls the RF switch to select the second path 37 to deliver the notched test signal to the second variable attenuator 44.

The controller 32 can control the measurement device 52 to measure the total power level of the notched test signal.

At 1216, the controller 32 can control the second variable attenuator 44 to adjust the power level (e.g., amplitude) of the notched test signal to match a preselected nominal power level.

The method can return to 1214, where the controller 32 controls the RF switch 42 to select the first path 35 to deliver the unnotched test signal to the second variable attenuator 44. The controller 32 can control the measurement device 52 to measure the total power level of the unnotched test signal.

Returning to 1216, the controller 32 can control the second variable attenuator 44 to adjust the power level (e.g., amplitude) of the unnotched test signal to match a preselected nominal power level, such as the same preselected nominal power level of the notched test signal.

At 1218, the controller 32 performs calibration and normalization of the test signals (e.g., by repeating operations 1214 and 1216) for both paths 35 and 37 to ensure that the same normalized power level for both the unnotched test signal or the notched test signal is provided to the device under test 60. At 1220, the controller 32 controls the RF switch 42 to communicate the unnotched test signal or the notched test signal to the device under test 60.

Figure 5:
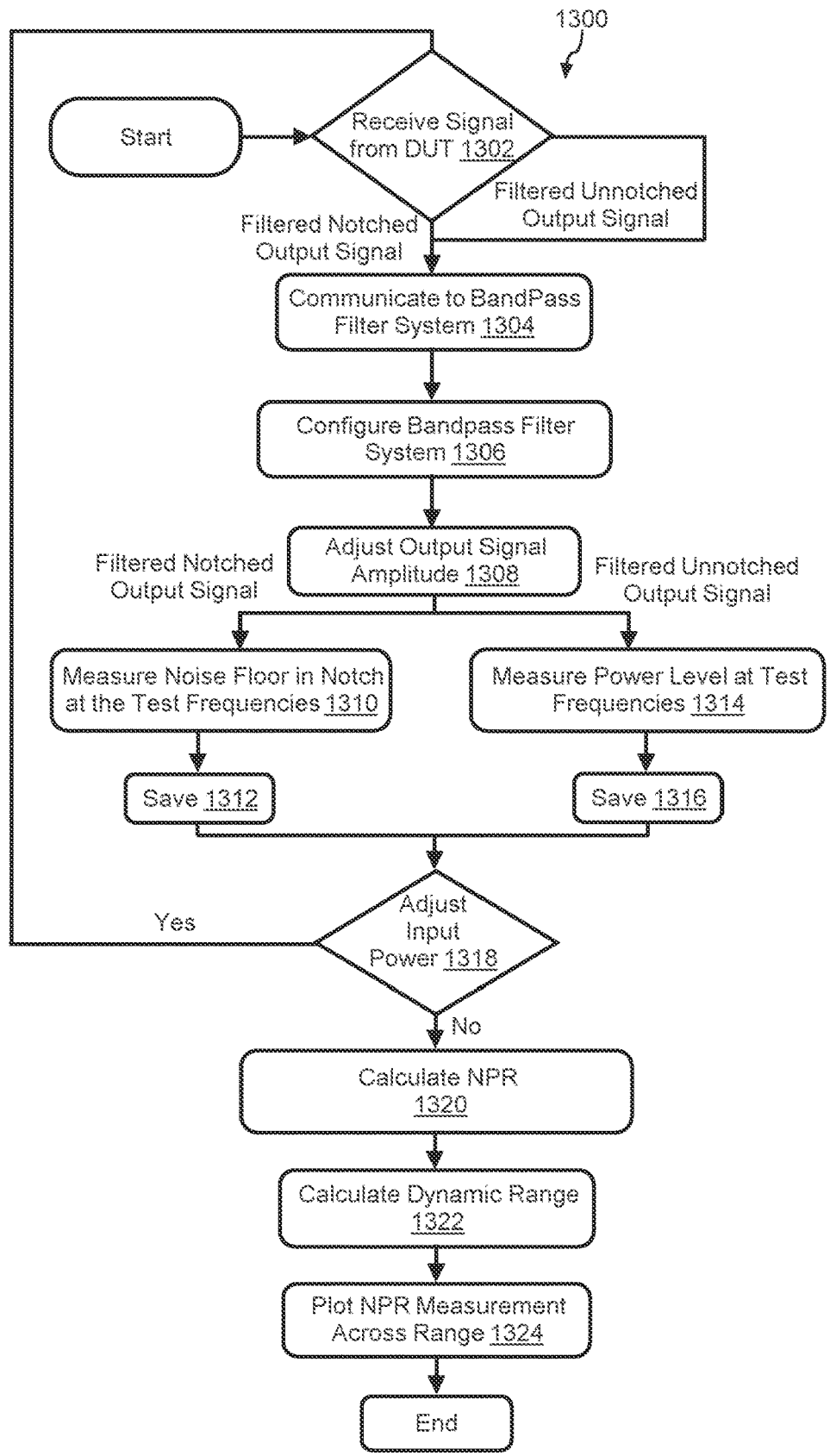
FIG. 5 depicts a flow diagram of an example measurement and calculation phase for RF performance characterization of RF devices according to example embodiments of the present disclosure.

FIG. 5 depicts a flow diagram of an example method 1300 implemented during a measurement and calculation phase for RF performance characterization of RF devices according to example embodiments of the present disclosure. The method 1300 can be implemented, for instance, using the system 10 of FIG. 1. Although FIG. 5 depicts steps performed in a particular order for purposes of illustration and discussion, the methods of the present disclosure are not limited to the particularly illustrated order or arrangement. The various steps of method 1300 can be omitted, rearranged, combined, modified, expanded, and can include steps not illustrated and/or adapted in various ways without deviating from the scope of the present disclosure.

At 1302, the RF test system 30 receives an output signal from the device under test 60. The output signal can be a notched output signal based on the notched test signal provided to the device under test 60 or an unnotched output signal based on the unnotched test signal provided to the device under test.

At 1304, the controller 32 can configure the bandpass filter system 48 to match or to be synchronized with the notch filter system 40. More particularly, the controller 32 can configure the bandpass filter system 48 to provide a bandpass response at the test frequencies associated with the notches in the notched test signal implemented by the notch filter system 40.

At 1306, the controller 32 can adjust the bandpass filter system 48 based at least in part on the characteristics (e.g., signal channel) of the test signal. For instance, the controller 32 can adjust the bandpass filter system 48 based on the test signal being an AWGN-based test signal, SC-QAM test signal, OFDM test signal, or other test signal. The filtered notched output signal can pass through the bandpass filter system 48 to the third variable attenuator 50.

At 1308, the controller 32 can control the third variable attenuator 50 to adjust the power level (e.g., amplitude) of the filtered notched output signal to a desired level for the measurement device 52.

At 1310, the controller 32 controls the measurement device 52 to measure a noise floor accumulated in the notches at the respective test frequencies. The controller 32 can communicate the measured values to the RF performance tester 18. At 1312, the RF performance tester 18 can save the measured values at each test frequency, for instance, in an array.

The method 1300 can repeat the operations 1304, 1306, and 1308 for an unnotched output signal from the device under test 60 based on an unnotched test signal. At 1314, the controller 32 controls the measurement device 52 to measure the full signal power of the filtered unnotched output signal at each of the test frequencies. The controller 32 can communicate the measured values to the RF performance tester 18. At 1316, the RF performance tester 18 can save the measured values at each test frequency, for instance, in an array.

As shown at 1318, the controller 32 can determine whether to repeat operations of 1302, 1304, 1306, 1308, 1310, 1312, and 1316 for input test signals at different input power levels. If so, the controller 32 can control the second variable attenuator 44 to increase the power level of the test signals (both the notched test signals and the unnotched test signals) from a first power level to a second power level. The method 1300 can repeat operations 1302, 1304, 1306, 1308, 1310, 1312 for the notched output signals based on the notched signals of each input power level. The method 1300 can repeat operations 1302, 1304, 1306, 1308, 1314, and 1316 for the unnotched output signals based on the unnotched test signals of each input power level. The method 1300 can repeat these operations for multiple input power levels of the test signal (e.g., adjusted in stepped increments specified by the user) to obtain measurements associated with test signals of a plurality of different input power levels. These measurements can be used to determine a dynamic range of the device under test 60 and to plot NPR measurements or other noise performance metric across a power level range for the device under test 60.

At 1320, the RF performance tester 18 can calculate the NPR or other noise performance metric at each of the test frequencies. More particularly, for each test frequency, the RF performance tester 18 can calculate the NPR by subtracting the power levels saved at 1312 from the power levels saved at 1316. This can be repeated for each input power level of the test signal provided to the device under test 60 to determine NPR at each test frequency and at each input power level. The RF performance tester 18 can also apply any appropriate correction factors.

At 1322, the RF performance tester 18 can determine a dynamic range for the device under test 60. More particularly, for each test frequency, the RF performance tester 18 can analyze NPR determined for each input power level to determine a first boundary between a linear region and a non-linear region for the device under test 60. The RF performance tester 18 can analyze NPR determined for each input power level to determine a second boundary between a clipping region and a non-clipping region for the device under test 60. The dynamic range at each test frequency can be determined to be the input power level range between the first boundary and the second boundary.

In some embodiments, the RF performance tester 18 can determine a cumulative dynamic range across all test frequencies. For instance, the RF performance tester 18 can set a first cumulative boundary (e.g., a power level floor) for the cumulative dynamic range based on the maximum power level associated with all the first boundaries of the dynamic ranges for the plurality of test frequencies. The RF performance tester 18 can set a second cumulative boundary (e.g., a power level ceiling) for the cumulative dynamic range based on the minimum power level associated with all the second boundaries of the dynamic ranges for the test frequencies. The cumulative dynamic range can be determined as the range between the first cumulative boundary and the second cumulative boundary. A user can set an operating range for the device under test 60 based on the cumulative dynamic range.

At 1324, the RF performance tester 18 can determine a plot for the NPR across the input power level ranges (e.g., the power measurement range), such as plot 1030 depicted in FIG. 2D. The RF performance tester 18 can provide the plot for display in a graphical user interface 22 presented on a display device 20. The RF performance tester 18 can provide the plot for display with a horizontal axis representing input power level and with a vertical axis representing the NPR.

Figure 6:
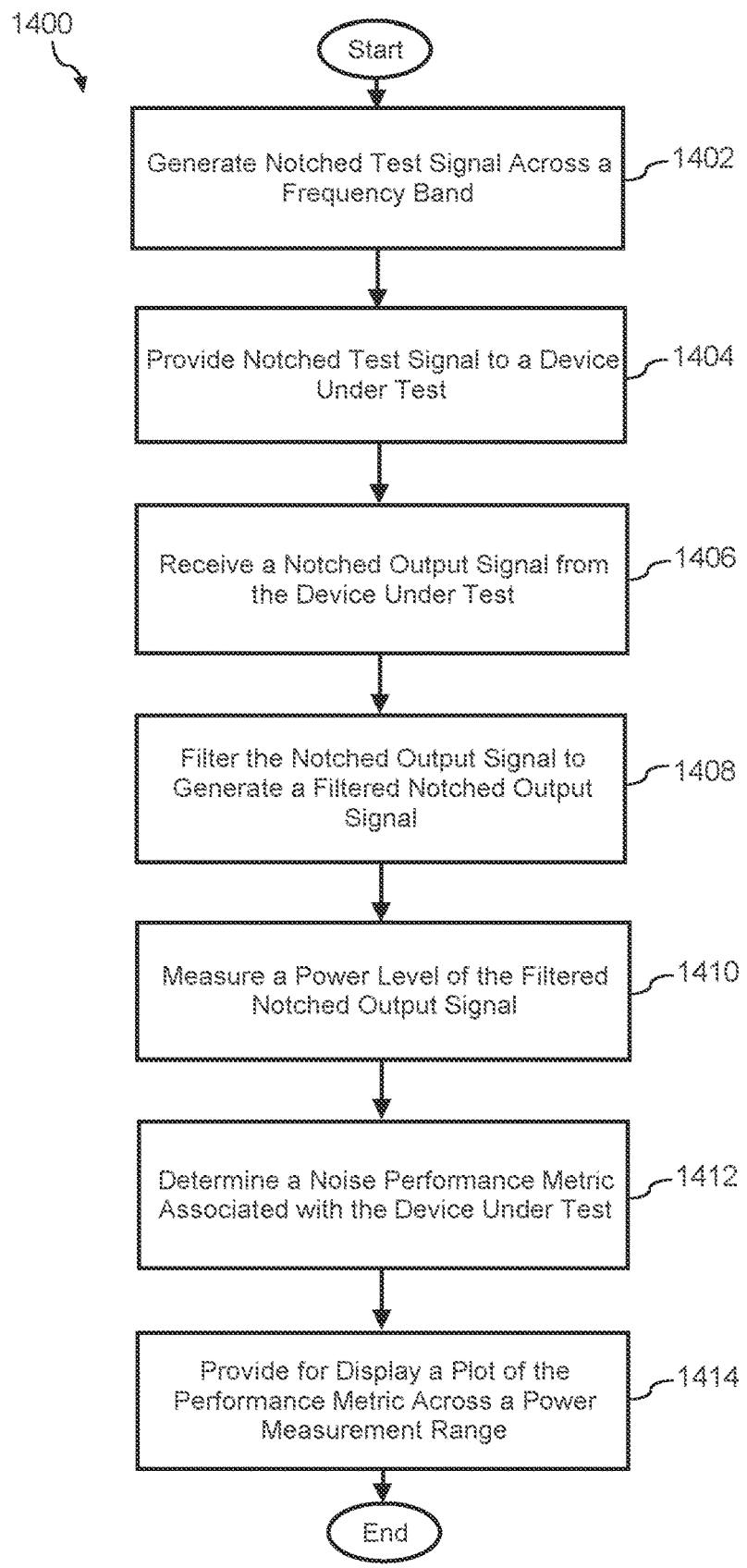
FIG. 6 depicts a flow diagram of an example method for RF performance characterization of RF devices according to example embodiments of the present disclosure.

FIG. 6 depicts a flow diagram of an example method 1400 for RF performance characterization of RF devices according to example embodiments of the present disclosure. The method 1400 can be implemented, for instance, using the system 10 of FIG. 1. Although FIG. 6 depicts steps performed in a particular order for purposes of illustration and discussion, the methods of the present disclosure are not limited to the particularly illustrated order or arrangement. The various steps of method 1400 can be omitted, rearranged, combined, modified, expanded, and can include steps not illustrated and/or adapted in various ways without deviating from the scope of the present disclosure.

At 1402, the method 1400 can include generating a notched test signal across a frequency band, such as a frequency band that spans from about 54 MHz to about 1.8 GHz. The notched test signal can include a plurality of frequency notches (e.g., stop bands). Each frequency notch can be associated with one of a plurality of test frequencies. The method 1400 can generate the notched test signal by configuring a notch filter system. In some embodiments, the method 1400 can additionally configure a bandpass filter system to match or to be synchronized with the notch filter system.

Figure 7:
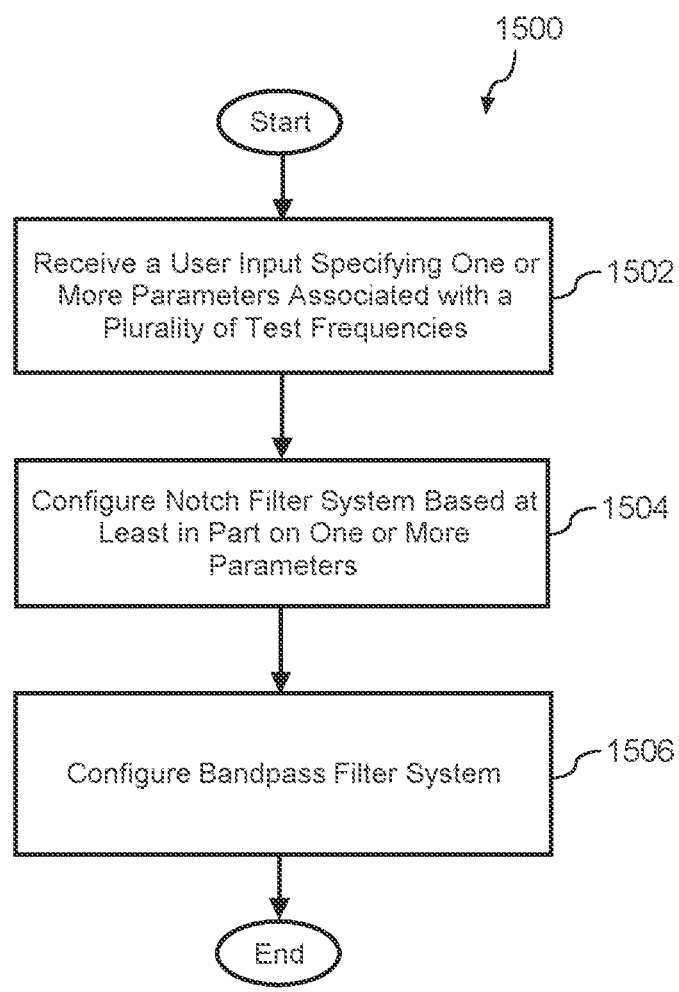
FIG. 7 depicts a flow diagram of an example method for RF performance characterization of RF devices according to example embodiments of the present disclosure.

More particularly, FIG. 7 depicts an example method 1500 for generating a notched test signal according to example embodiments of the present disclosure. The method 1500 can be implemented, for instance, using the system 10 of FIG. 1. Although FIG. 7 depicts steps performed in a particular order for purposes of illustration and discussion, the methods of the present disclosure are not limited to the particularly illustrated order or arrangement. The various steps of method 1500 can be omitted, rearranged, combined, modified, expanded, include steps not illustrated and/or adapted in various ways without deviating from the scope of the present disclosure.

At 1502, the method 1500 can include receiving a user input (e.g., via a graphical user interface) specifying one or more parameters associated with a plurality of test frequencies. For instance, the method 1500 can include receiving a user input specifying parameters such as individual test frequencies, depth of notches, bandwidth of notches, and other parameters.

At 1504, the method 1500 can include configuring a notch filter system to implement the frequency notches in the test signal based at least in part on the one or more parameters associated with the plurality of test frequencies. The method 1500 can configure the notch filter system to implement the plurality of frequency notches in a test signal by filtering (e.g., stop band filtering) the test signal at each of the plurality of test frequencies.

At 1506, the method 1500 can include configuring a bandpass filter system to be synchronized with or to match the notch filter system. More particularly, the method 1500 can include configuring the bandpass filter system to provide a band pass response for signals at each of the plurality of test frequencies. The bandpass filter system can filter notched output signals and unnotched output signals received from a device under test as discussed with reference to FIG. 6 below.

Referring to FIG. 6 at 1404, the method 1400 can include providing a notched test signal to a device under test (e.g., a multi-carrier broadband device configured to process cable television signals). In some embodiments, the method 1400 can include at 1404 providing the notched test signal to a device under test at a plurality of different input power levels.

At 1406, the method 1400 can include receiving a notched output signal from the device under test. The notched output signal can be based on the notched test signal. For instance, the notched output signal can be the output of the device under test resulting from the processing and/or transmission of the notched test signal by the device under test.

At 1408, the method 1400 can include filtering the notched output signal to provide a bandpass response at each of the plurality of test frequencies to generate a filtered notched output signal. For instance, the method 1400 can use the bandpass filter system to filter the notched output signal to provide the bandpass response at the one or more test frequencies.

At 1410, the method 1400 can include measuring a power level of the filtered notched output signal. More particularly, the method can include measuring the power level of noise accumulated in the notches at the device under test at each of the plurality of test frequencies.

At 1412, the method 1400 can include determining a noise performance metric associated with the device under test based at least in part on the power level of the filtered output signal. The noise performance metric can be, for instance, noise-to-power ratio (NPR). The method 1400 can include determining other noise performance metrics without deviating from the scope of the present disclosure, such as carrier-to-noise+interference, carrier-to-noise+distortion, CIN, CCN, or other noise performance metric.

Figure 8:
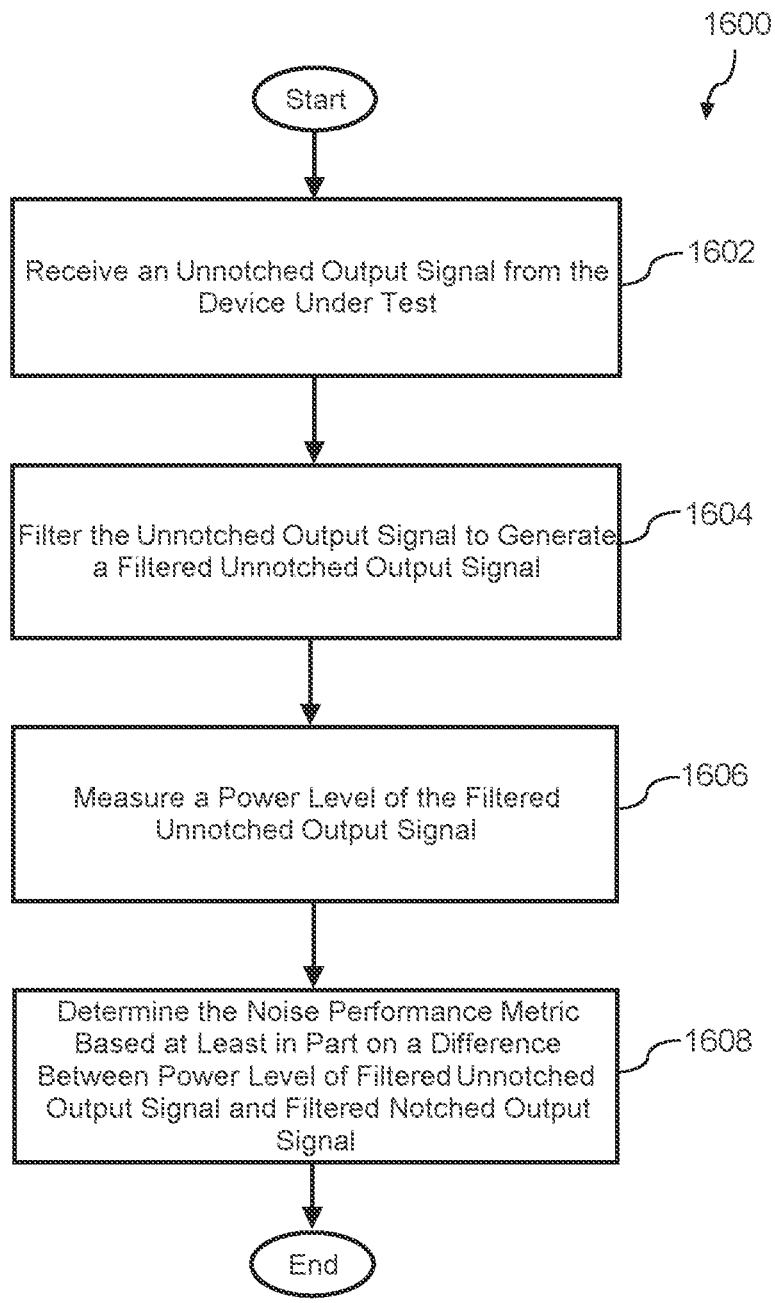
FIG. 8 depicts a flow diagram of an example method for RF performance characterization of RF devices according to example embodiments of the present disclosure.

FIG. 8 depicts a flow diagram of an example method 1600 for determining a noise performance metric associated with the device under test based at least in part on the power level of the filtered output signal according to example embodiments of the present disclosure. The method 1600 can be implemented, for instance, using the system 10 of FIG. 1.

Although FIG. 8 depicts steps performed in a particular order for purposes of illustration and discussion, the methods of the present disclosure are not limited to the particularly illustrated order or arrangement. The various steps of method 1600 can be omitted, rearranged, combined, modified, expanded, and can include steps not illustrated and/or adapted in various ways without deviating from the scope of the present disclosure.

At 1602, the method 1600 can include receiving an unnotched output signal from the device under test. The unnotched output signal can be based on the unnotched test signal. For instance, the unnotched output signal can be the output of the device under test resulting from the processing and/or transmission of the unnotched test signal by the device under test.

At 1604, the method 1600 can include filtering the unnotched output signal to provide a bandpass response at each of the plurality of test frequencies to generate a filtered unnotched output signal. For instance, the method 1600 can use the bandpass filter system to filter the unnotched output signal to provide the bandpass response at the one or more test frequencies.

At 1606, the method 1600 can include measuring a power level of the filtered unnotched output signal from the device under test. For instance, the method 1600 can include measuring a power level of the filtered unnotched output signal at each of the test frequencies.

At 1608, the method 1600 can include determining the noise performance metric based at least in part on a difference between the power level for the filtered unnotched output signal measured at 1606 and the power level of the filtered notched output signal measured at 1410 of FIG. 6. The method 1600 can repeat operations 1602 and 1604 for each input power level of the test signals provided to the device under test and for each test frequency. In this way, the method 1600 can determine a noise performance metric at each test frequency and at each input power level.

Referring to FIG. 6 at 1414, the method 1400 can include providing for display a plot of NPR across a power measurement range in a graphical user interface presented on a display device, such as example plot 1030 of FIG. 2D. In some embodiments, the method 1400 of FIG. 6 can display the plot with a horizontal axis representing input power level and with a vertical axis representing the NPR. The method 1400 can provide output plots for multiple test frequencies to provide a full noise performance characterization of the device under test across multiple operational frequencies.

Figure 9:
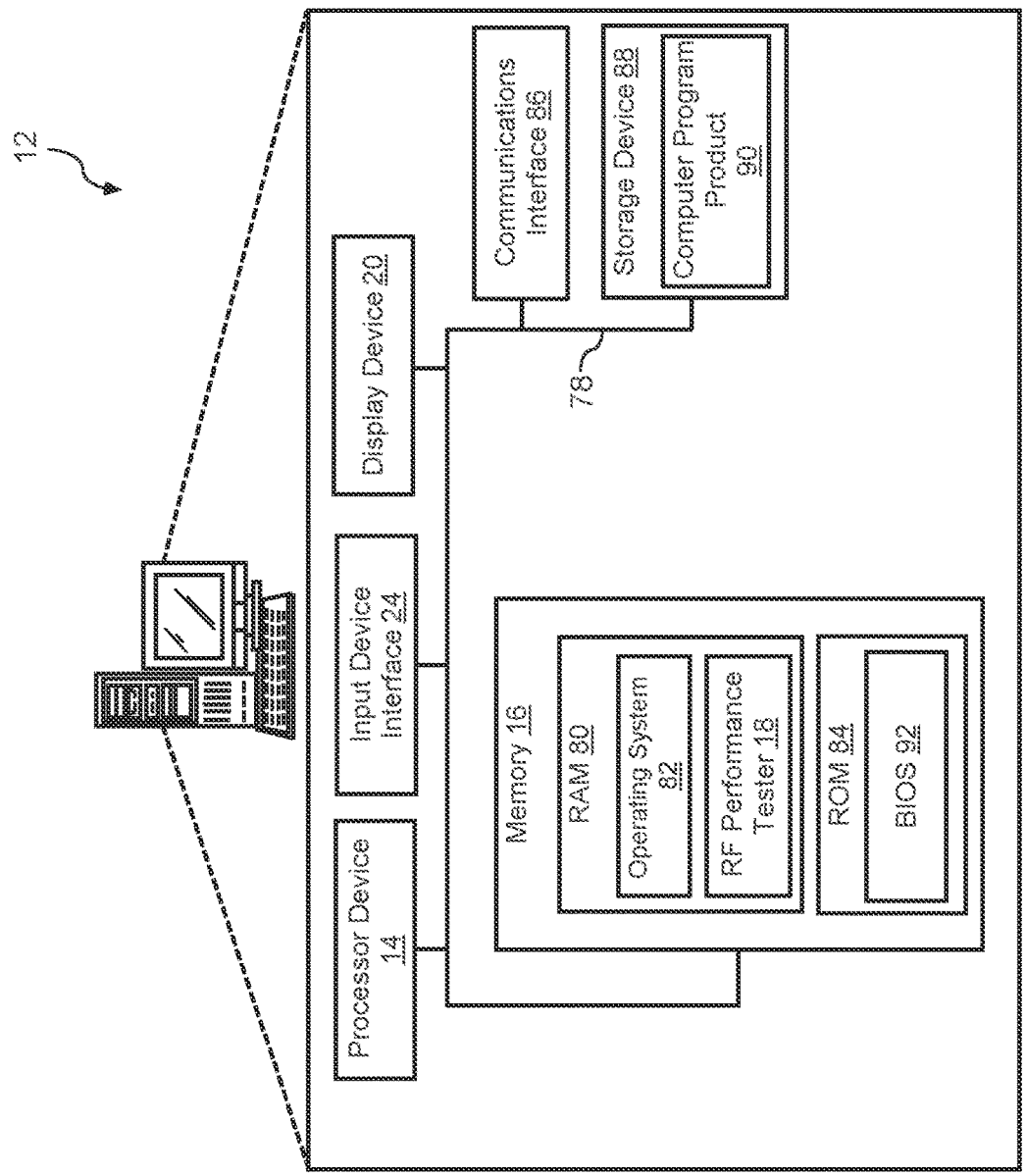
FIG. 9 depicts a block diagram of an example computing device according to example embodiments of the present disclosure.

FIG. 9 is a block diagram of an example computing device 12 for implementing the examples according to the present disclosure. The computing device 12 of FIG. 9 can be representative of any computing device described herein. The computing device 12 or any other computing device provided herein may comprise any computing or electronic device capable of including firmware, hardware, and/or executing software instructions to implement the functionality described herein, such as a computer server, a desktop computing device, a laptop computing device, a smartphone, a computing tablet, or the like. The computing device 12 includes the processor device 14, the memory 16, and a system bus 78. The system bus 78 provides an interface for system components including, but not limited to, the memory 16 and the processor device 14. The processor device 14 can be any commercially available or proprietary processor.

The system bus 78 may be any of several types of bus structures that may further interconnect to a memory bus (with or without a memory controller), a peripheral bus, and/or a local bus using any of a variety of commercially available bus architectures. The memory 16 may include non-volatile memory 84 (e.g., read-only memory (ROM), erasable programmable read-only memory (EPROM), electrically erasable programmable read-only memory (EEPROM), etc.), and volatile memory 80 (e.g., random-access memory (RAM)). A basic input/output system (BIOS) 92 may be stored in the non-volatile memory 84 and can include the basic routines that help to transfer information between elements within the computing device 12. The volatile memory 80 may also include a high-speed RAM, such as static RAM, for caching data.

The computing device 12 may further include or be coupled to a non-transitory computer-readable storage medium such as the storage device 88, which may comprise, for example, an internal or external hard disk drive (HDD) (e.g., enhanced integrated drive electronics (EIDE) or serial advanced technology attachment (SATA)), HDD (e.g., EIDE or SATA) for storage, flash memory, or the like. The storage device 88 and other drives associated with computer-readable media and computer-usable media may provide non-volatile storage of data, data structures, computer-executable instructions, and the like. A number of modules can be stored in the storage device 88 and in the volatile memory 80, including an operating system 82 and one or more program modules, such as the RF performance tester 18, which may implement the functionality described herein in whole or in part. All or a portion of the examples may be implemented as a computer program product 90 stored on a transitory or non-transitory computer-usable or computer-readable storage medium, such as the storage device 88, which includes complex programming instructions, such as complex computer-readable program code, to cause the processor device 14 to carry out the steps and operations described herein. Thus, the computer-readable program code can comprise software instructions for implementing the functionality of the examples described herein when executed on the processor device 14. The processor device 14, in conjunction with the RF performance tester 18 in the volatile memory 80, may serve as a controller, or control system, for the computing device 12 that is to implement the functionality described herein.

An operator may also be able to enter one or more configuration commands through a keyboard (not illustrated), a pointing device such as a mouse (not illustrated), or a touch-sensitive surface such as a display device. Such input devices may be connected to the processor device 14 through an input device interface 24 that is coupled to the system bus 78 but can be connected by other interfaces such as a parallel port, an Institute of Electrical and Electronic Engineers (IEEE) 1394 serial port, a Universal Serial Bus (USB) port, an IR interface, and the like.

The computing device 12 may also include the communications interface 86 suitable for communicating with other devices (e.g., over a network) as appropriate or desired. The computing device 12 may also include a display device 20 (or video port operable to interface with a display device 20), to provide information to a user, such as through a graphical user interface.

The technology discussed herein makes reference to computing devices and systems, as well as actions taken, and information sent to and from such systems. The inherent flexibility of computer-based systems allows for a great variety of possible configurations, combinations, and divisions of tasks and functionality between and among components. For instance, processes discussed herein can be implemented using a single device or component or multiple devices or components working in combination. Databases and applications can be implemented on a single system or distributed across multiple systems. Distributed components can operate sequentially or in parallel.

The depicted and/or described steps are merely illustrative and can be omitted, combined, and/or performed in an order other than that depicted and/or described; the numbering of depicted steps is merely for ease of reference and does not imply any particular ordering is necessary or preferred.

The functions and/or steps described herein can be embodied in computer-usable data and/or computer-executable instructions, executed by one or more computers and/or other devices to perform one or more functions described herein. Generally, such data and/or instructions include routines, programs, objects, components, data structures, or the like that perform particular tasks and/or implement particular data types when executed by one or more processors in a computer and/or other data-processing device. The computer-executable instructions can be stored on a computer-readable medium such as a hard disk, optical disk, removable storage media, solid-state memory, read-only memory (ROM), random-access memory (RAM), or the like. As will be appreciated, the functionality of such instructions can be combined and/or distributed as desired. In addition, the functionality can be embodied in whole or in part in firmware and/or hardware equivalents, such as integrated circuits, application-specific integrated circuits (ASICs), field-programmable gate arrays (FPGAs), or the like. Particular data structures can be used to implement one or more aspects of the disclosure more effectively, and such data structures are contemplated to be within the scope of computer-executable instructions and/or computer-usable data described herein.

Although not required, one of ordinary skill in the art will appreciate that various aspects described herein can be embodied as a method, system, apparatus, and/or one or more computer-readable media storing computer-executable instructions. Accordingly, aspects can take the form of an entirely hardware embodiment, an entirely software embodiment, an entirely firmware embodiment, and/or an embodiment combining software, hardware, and/or firmware aspects in any combination.

As described herein, the various methods and acts can be operative across one or more computing devices and/or networks. The functionality can be distributed in any manner or can be located in a single computing device (e.g., server, client computer, user device, or the like).

Aspects of the disclosure have been described in terms of illustrative embodiments thereof. Numerous other embodiments, modifications, and/or variations within the scope and spirit of the appended claims can occur to persons of ordinary skill in the art from a review of this disclosure. For example, one of ordinary skill in the art can appreciate that the steps depicted and/or described can be performed in other than the recited order and/or that one or more illustrated steps can be optional and/or combined. Any and all features in the following claims can be combined and/or rearranged in any way possible.

While the present subject matter has been described in detail with respect to various specific example embodiments thereof, each example is provided by way of explanation, not limitation of the disclosure. Those skilled in the art, upon attaining an understanding of the foregoing, can readily produce alterations to, variations of, and/or equivalents to such embodiments. Accordingly, the subject disclosure does not preclude inclusion of such modifications, variations, and/or additions to the present subject matter as would be readily apparent to one of ordinary skill in the art. For instance, features illustrated and/or described as part of one embodiment can be used with another embodiment to yield a still further embodiment. Thus, it is intended that the present disclosure covers such alterations, variations, and/or equivalents.

Individuals will recognize improvements and modifications to the preferred examples of the disclosure. All such improvements and modifications are considered within the scope of the concepts disclosed herein and the claims that follow.

What is claimed is:

1. A method, comprising:
   generating a notched test signal across a frequency band, the notched test signal comprising a plurality of frequency notches, each frequency notch associated with one of a plurality of test frequencies;
   providing the notched test signal to a device under test;
   receiving a notched output signal from the device under test; and
   determining a noise performance metric associated with the device under test based at least in part on one or more power levels at the test frequencies of the notched output signal.

2. The method of claim 1, wherein the frequency band spans from about 54 MHz to about 1.8 GHz.

3. The method of claim 1, wherein generating the notched test signal comprises:
   configuring a notch filter system to implement the plurality of frequency notches in a test signal by filtering the test signal at the plurality of test frequencies.

4. The method of claim 3, wherein configuring the notch filter system comprises:
   receiving a user input specifying one or more parameters associated with the plurality of test frequencies; and
   configuring the notch filter system based at least in part on the one or more parameters associated with the plurality of test frequencies.

5. The method of claim 3, further comprising synchronizing a bandpass filter system with the notch filter system such that the bandpass filter system provides a bandpass response at each of the plurality of test frequencies.

6. The method of claim 1, wherein determining a noise performance metric associated with the device under test based at least in part on one or more power levels at the test frequencies of the notched output signal comprises:
   receiving an unnotched output signal from the device under test;
   filtering the unnotched output signal to provide a bandpass response at each of the plurality of test frequencies to generate a filtered unnotched output signal;
   measuring a power level of the filtered unnotched output signal from the device under test at each of the test frequencies; and
   determining the noise performance metric associated with the device under test based at least in part on the filtered unnotched output signal.

7. The method of claim 1, wherein the noise performance metric is a noise-to-power ratio.

8. The method of claim 7, further comprising providing for display a plot of noise-to-power ratio across a power measurement range in a graphical user interface presented on a display device.

9. The method of claim 1, wherein the device under test is a multi-carrier broadband device configured to process cable television signals.

10. A system, comprising:
    a signal generator configured to generate a test signal across a frequency band;
    a notch filter system coupled to the signal generator, the notch filter system configured to implement a plurality of notch filters in the test signal to generate a notched test signal, the notched test signal comprising a frequency notch at each of a plurality of test frequencies;
    a bandpass filter system, the bandpass filter system configured to implement a plurality of bandpass filters in a notched output signal to provide a bandpass response at each of the plurality of test frequencies to generate a filtered notched output signal; and
    a measurement device configured to measure a power level of the filtered notched output signal at each of the plurality of test frequencies; and
    wherein the system is configured to determine a noise performance metric associated with a device under test based at least in part on the power level of the filtered notched output signal.

11. The system of claim 10, further comprising a controller, the controller operable to configure the notch filter system and to configure the bandpass filter system based at least in part on a user input specifying one or more parameters associated with the plurality of test frequencies.

12. The system of claim 10, wherein the measurement device is further configured to measure a power level of a filtered unnotched output signal at each of the plurality of test frequencies, the system configured to determine the noise performance metric associated with the device under test based at least in part on a difference between the power level of the filtered unnotched output signal and the power level of the filtered notched output signal.

13. The system of claim 10, further comprising:
    a splitter configured to split the test signal between a first path and a second path, the first path configured to pass an unnotched test signal, the second path comprising the notch filter system and configured to pass the notched test signal; and
    an RF switch configured to switch between the first path and the second path to select the unnotched test signal or the notched test signal.

14. The system of claim 10, wherein the measurement device comprises a power meter or a spectrum analyzer.

15. The system of claim 10, further comprising a display device, the system configured to provide for display a plot of noise-to-power ratio for the device under test across a power measurement range in a graphical user interface presented on the display device.

16. A computing device, comprising:
    a memory; and
    a processor device coupled to the memory to:
      generate a notched test signal across a frequency band, the notched test signal comprising a plurality of frequency notches, each frequency notch associated with one of a plurality of test frequencies;
      provide the notched test signal to a device under test;
      receive a notched output signal from the device under test; and
      determine a noise performance metric associated with the device under test based at least in part on one or more power levels at the test frequencies of the notched output signal.

17. The computing device of claim 16, wherein the processor device is further to:

obtain a power level measurement of a filtered unnotched output signal from the device under test at each of the plurality of test frequencies.

18. The computing device of claim 17, wherein the processor device is further to determine a noise performance metric based at least in part on the filtered unnotched output signal.

19. The computing device of claim 18, wherein the processor device is further to provide for display a plot of noise-to-power ratio for the device under test across a power measurement range in a graphical user interface presented on a display device.

* * * * *